United States Patent
Block et al.

(10) Patent No.: US 9,297,871 B2
(45) Date of Patent: Mar. 29, 2016

(54) MAGNETIC RESONANCE SYSTEM AND METHOD TO GENERATE A MAGNETIC RESONANCE IMAGE OF AN EXAMINATION SUBJECT

(71) Applicants: Kai Tobias Block, New York, NY (US); Matthias Fenchel, Erlangen (DE)

(72) Inventors: Kai Tobias Block, New York, NY (US); Matthias Fenchel, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 629 days.

(21) Appl. No.: 13/714,837

(22) Filed: Dec. 14, 2012

(65) Prior Publication Data

US 2013/0154640 A1    Jun. 20, 2013

(30) Foreign Application Priority Data

Dec. 16, 2011 (DE) .......................... 10 2011 088 828

(51) Int. Cl.
*G01V 3/00* (2006.01)
*G01R 33/48* (2006.01)
*G06F 17/40* (2006.01)
(Continued)

(52) U.S. Cl.
CPC ............ *G01R 33/48* (2013.01); *G01R 33/4838* (2013.01); *G01R 33/56545* (2013.01); *G06F 17/40* (2013.01); *G01R 33/3415* (2013.01); *G01R 33/4816* (2013.01); *G01R 33/4824* (2013.01)

(58) Field of Classification Search
CPC ...................................................... G01R 33/56
USPC .................................. 324/309, 307, 314, 306
See application file for complete search history.

(56) References Cited

U.S. PATENT DOCUMENTS 6,876,201 B2 *  4/2005  Takizawa et al. ............. 324/318
7,042,217 B2 *  5/2006  Zwanenburg et al. ........ 324/309
(Continued)

FOREIGN PATENT DOCUMENTS

CN     101915901 A    12/2010
CN     101995561 A     3/2011
JP     2009022319 A    2/2009

OTHER PUBLICATIONS

Xue et al., "Automatic Coil Selection for Streak Artifact Reduction in Radial MRI," Magnetic Resonance in Medicine, vol. 67 (2012), pp. 470-476.

(Continued)

*Primary Examiner* — Louis Arana
(74) *Attorney, Agent, or Firm* — Schiff Hardin LLP

(57) ABSTRACT

The invention concerns a method to generate an MR image of an examination subject of MR signals of the examination subject being detected with a receiver coil element of a magnetic resonance system. A spatially related sensitivity is determined for the receiver coil element. A mask is generated for the receiver coil element depending on the sensitivity of the receiver coil element in order to therewith mask a region of the MR image, in which region the receiver coil element has at least one predetermined sensitivity. At least one RF excitation pulse and at least one magnetic field gradient are activated to acquire MR data with the receiver coil element, and a preliminary MR image is generated depending on MR data acquired therewith. The mask of the receiver coil element is applied to the preliminary MR image in order to generate an MR image of the receiver coil element, and an MR image of the examination subject is generated from the MR image for the receiver coil element.

22 Claims, 5 Drawing Sheets

(51) Int. Cl.
*G01R 33/483* (2006.01)
*G01R 33/565* (2006.01)
*G01R 33/3415* (2006.01)

(56) References Cited

U.S. PATENT DOCUMENTS

| | | | |
|---|---|---|---|
| 7,956,611 B2* | 6/2011 | Nakai | ............ 324/307 |
| 2002/0176113 A1 | 11/2002 | Edgar | |
| 2004/0135579 A1 | 7/2004 | Takizawa et al. | |
| 2008/0050444 A1 | 2/2008 | Taneja et al. | |

OTHER PUBLICATIONS

Kai et al., "Simple Method for Attenuation of Streaking Artifacts from Peripheral Intensity Accumulation," Abstract 484, ISMRM.

She et al., "Image Reconstruction From Phased-Array MRI Data Based on Multichannel Blind Deconvolution," ISBI (2010), pp. 760-763.

Morrison et al., "Multichannel Estimation of Coil Sensitivities in Parallel MRI," ISBI (2007), pp. 117-120.

Wargo, "Sense Parallel MRI Development for Small Animal Imaging Studies at 9.4T," Master Thesis, Vanderbilt University (2007).

* cited by examiner

MAGNETIC RESONANCE SYSTEM AND METHOD TO GENERATE A MAGNETIC RESONANCE IMAGE OF AN EXAMINATION SUBJECT

BACKGROUND OF THE INVENTION

1. Field of the Invention

The present invention concerns a method to generate an MR image of an examination subject with the use of a magnetic resonance system.

2. Description of the Prior Art

In conventional imaging with a magnetic resonance system (MRI—"magnetic resonance imaging"), certain image artifacts are caused by excited spins that are located outside of the prescribed field of view (FOV—"field of view"). These artifacts occur particularly in MR imaging methods or techniques that use a spatially non-selective excitation or a slice-selective excitation, insofar as the dimensions of the examination subject orthogonal to the slice selection direction (vector situated orthogonally to the slice) exceed the prescribed dimensions of the field of view. With a radial scanning of k-space, these artifacts occur as interfering stripes outside of a disc or sphere around the excited subject. For example, when MR images of a human head are generated, these stripes are caused by a high intensity spin enrichment (accumulation) outside of the field of view in the region of the neck of the patient, which is detected by the coil elements that are located in proximity to the neck region.

The imaging properties in MR imaging can be described with the use of the point function or point spread function (PSF), which has a direct relationship to the scan patterns that are used in order to acquire information in k-space. Mathematically, the data acquisition along a trajectory in k-space can be considered as a projection in the sense of a multiplication of k-space on the trajectory that corresponds to a convolution of the subject by means of a Fourier transformation of the trajectory in image space. The imaging method can therefore be described in image space by a folding of the excited spins by means of the Fourier transformation of the trajectory or by means of the point response.

In radial scanning of k-space, wherein the information in k-space is acquired along defined spokes, the point function has a peak value in the middle, which is surrounded by a nearly homogenous disc (in two-dimensional scanning) or a nearly homogenous sphere (in three-dimensional scanning) with a negligible intensity. At a defined distance from the peak value, the point function has radial stripes that proceed outwardly (toward the edge) from the disc (or the sphere). The distance is also known as a Nyquist radius. The distance becomes larger as the number of acquired spokes increases. The distance is therefore used to define the number of required spokes so that the image of the corresponding subject can be generated without visible stripe-shaped artifacts.

In practice, due to the limited available acquisition time, it is conventionally not possible to acquire sufficiently many spokes in order to satisfy this criterion for all dimensions. Therefore, excited spins that are located outside of the prescribed field of view can have a perturbing effect on the middle segment of the region of interest (ROI) if their intensity is high enough. This is a problem particularly in the use of saturated techniques (for example fat-saturation methods), which generally are no longer effective at a defined distance from the isocenter, because points with a high intensity occur at locations at the edge. This problem is intensified if reception coils or reception coil elements ("array coils") with a high sensitivity are used outside of the center, which leads to high signal peak signal values, so a large proportion of this intensity extends as radial stripes across the entire image. Moreover, excited spins (which are located at the edge of the field of view along the z-direction in which the gradient fields no longer have a linear relationship) lead to significant perturbations in the image.

These described image artifacts can lead to difficult problems, both for the observer of the images and for automatic, downstream methods (for example segmentation methods). It must be taken into account that precisely such segmentation methods are very sensitive to stripe-shaped artifacts. An important example in this regard is the acquisition and automatic post-processing (segmentation) of images that are generated with a radial, ultrashort sequence (UTE—"ultrashort echo time"), wherein an MR-based attenuation correction with a hybrid PET-MR imaging is used.

SUMMARY OF THE INVENTION

An object of the present invention is to acquire MR images such that fewer artifacts—in particular stripe-shaped artifacts—occur in comparison to the prior art.

This object is achieved in accordance with the present invention by a method to generate an MR image of an examination subject, wherein MR signals of the examination subject are acquired with a receiver coil element of a magnetic resonance system, that includes the following steps:

A spatially related sensitivity for the receiver coil element is determined. In other words, the sensitivity of the receiver coil element at this point is determined for each region of the field of view.

A mask for the receiver coil element is generated depending on the previously determined sensitivity of the receiver coil element in order to mask a region of the MR image with the aid of this mask, wherein the receiver coil element in this region has (at least) one predetermined sensitivity. Those regions of the field of view in which the receiver coil element has (at least) one predetermined sensitivity can be differentiated with the mask from those regions of the field of view in which the receiver coil element does not have this predetermined sensitivity.

One or more RF excitation pulses and one or more magnetic field gradients are activated in order to acquire MR data with the receiver coil element. By the switching of the RF excitation pulses and magnetic field gradients, a defined volume segment in the examination subject is excited and MR data are subsequently acquired, as is typical according to the prior art.

Based on MR data which have been acquired by the receiver coil element, a preliminary MR image is created for this receiver coil element.

The mask of the receiver coil element is applied to the preliminary MR image that has been generated for this receiver coil element, such that an MR image of the receiver coil element is created. In particular, with the use of the mask those regions of the preliminary MR image are masked in which the receiver coil element does not have the predetermined sensitivity.

The complete MR image of the examination subject is generated based on the MR image of the receiver coil element.

Because the mask for the receiver coil element is applied to the preliminary MR image, the contribution of the receiver coil element is limited to those regions for which it is known that the receiver coil element in these regions has a sufficiently good receiver sensitivity. Stripe-shaped artifacts that occur in the preliminary MR image outside of the sensitivity region of the receiver coil element are thereby removed from the final MR image by the application of the mask. Artifacts are thereby suppressed while the relevant MR signals are completely retained. The determination of the spatially related sensitivity can thereby take place in calibration passes ("calibration scans") that can be implemented in an arbitrary manner so that no additional time (in addition to the acquisition time) is required to determine the spatially related sensitivity.

According to the invention, the generation of the mask of the receiver coil element can take place in multiple different ways depending on the sensitivity of the receiver coil element.

In an embodiment of the invention, the mask of the receiver coil element is generated by the following steps.

A special MR image is generated based exclusively on those MR data that have been acquired by this receiver coil element. In other words: no MR data which have been acquired by a different receiver coil element are used in the generation of the special MR image.

The mask is generated depending on the maximum pixel value within the special MR image. Expressed differently: that image pixel which, of all image pixels of the special MR image, has the maximum value is determined within the special MR image.

The image pixel with the maximum pixel value normally characterizes that region within the special MR image in which the sensitivity of the receiver coil element is highest. The mask of the receiver coil element can therefore be created very well based on this maximum pixel value.

To generate the mask, a pixel value curve or intensity curve can be interpolated based on the pixels of the special MR image, such that intensity values or pixel values are also present for image pixels between the image pixels of the special MR image. For example, a threshold pixel can be determined by multiplying the maximum pixel value by a predetermined percentile (smaller than 100%). Based on this threshold pixel value, a mask value for the mask to be generated is then generated pixel-by-pixel among the pixels of the preliminary MR image. The mask value of the respective image pixel thus receives a first value (for example a value of 0) if, according to the interpolated intensity curve, the pixel value of the respective pixel of the preliminary MR image is less than the threshold pixel value. Otherwise, if—according to the intensity curve—the pixel value of the respective pixel of the preliminary MR image is greater than or equal to the threshold pixel value, the mask value of the respective pixel is set to a second value (for example a value of 1).

Normally, the pixel value represents the brightness of the corresponding image pixel or image point. Because, in the generated mask, all image points whose pixel value (according to the interpolated pixel value curve) is less than the threshold pixel value or is darker than the threshold pixel value, have the second value, in a corresponding application of the mask all regions of the preliminary MR image to be processed, in which regions the sensitivity of the receiver coil element is too low, are removed with the mask (or are at least attenuated).

According to a further embodiment of the invention, the mask of a receiver coil element is generated by the following steps.

A special MR image is generated depending on the MR data which have been acquired exclusively via the receiver coil element.

A frequency distribution is determined that, for the pixel values or intensities of the special MR image, indicates in what frequency the corresponding pixel value or the corresponding intensity occurs within the special MR image.

The mask of the receiver coil element is then generated depending on the previously created frequency distribution.

Image pixels of the special MR image that lie in that region of the special MR image in which the receiver coil element has a sufficient sensitivity normally have a high pixel value or a high intensity, in contrast to which pixel values of the special MR image that lie in a region of the special MR image in which the receiver coil element does not have a sufficient sensitivity have a low pixel value or a low intensity. Therefore, the mask values of the mask can be set with the use of the frequency distribution such that at least the majority of the image pixels of the special MR image (or of the preliminary MR image) are not filtered out when the mask to be created is applied to the special MR image (or the preliminary MR image).

For example, the two largest relative maximum values or maximums within the frequency distribution can be determined. A relative maximum value is understood as a local maximum, and it can be established, for example, that a predetermined minimum distance is to be maintained between these two relative maximum values. The threshold pixel value is determined such that the threshold pixel value lies between the pixel values of these two largest maximum values. For example, the threshold pixel value can correspond to a minimum of the frequency distribution that lies between the two largest relative maxima.

To generate the mask, the intensity curve is interpolated using the image pixels of the special MR image. The mask can then be generated based on this intensity curve such that the mask value of the respective pixel of the mask receives the first value (a value of 0, for example) when the pixel value of the respective pixel of the preliminary MR image lies below the threshold pixel value according to this intensity curve, and such that the mask value of the respective pixel of the mask receives the second value (a value of 1, for example) when, according to the intensity curve, the pixel value of the respective value of the preliminary MR image lies above the threshold pixel value or corresponds to the threshold pixel value.

Given a normal frequency distribution of the pixel values or intensities of the special MR image, a maximum occurs that corresponds to the pixel values in the middle of that region of the special MR image in which the sensitivity of the receiver coil element is sufficiently high. Another maximum of the frequency distribution corresponds to the pixel values that belong to pixels that are sufficiently far removed from the region of the special MR image in which the sensitivity of the receiver coil element is sufficiently high. This means that the other maximum corresponds to low pixel values which belong to dark image pixels in the special MR image. Because the threshold pixel value is located between these two maximums, the area around that region in which the sensitivity of the receiver coil element is sufficiently large is virtually masked out by the application of the mask that is formed with this threshold pixel value.

In a third embodiment of the invention, the mask of a receiver coil element is generated by the following steps.

The special MR image is generated depending exclusively on MR data which have been created by the receiver coil element.

A p-quantile of the pixel values of the special MR image is determined so that $p*100\%$ of the pixel values of the special MR image have a smaller pixel value than the pixel value of the p-quantile, wherein p corresponds to the shortfall proportion of the p-quantile. The p-quantile of the pixel values of the special MR image is accordingly defined such that $(1-p)$

*100% of the image pixels of the special MR image have a higher pixel value than the pixel value of the p-quantile, while p*100% of the image pixels of the special MR image have a lower pixel value than the pixel value of the p-quantile.

The mask of the receiver coil element is generated depending on the predetermined p-quantile.

To generate the mask, the intensity curve can be interpolated depending on the image pixels (including the corresponding pixel values) of the special MR image. For example, the mask of the receiver coil element can be generated based on this intensity curve such that the mask value of the respective pixel of the mask receives the first value (for example a value of 0) when the pixel value of the respective image pixel of the preliminary MR image is less than the pixel value of the p-quantile according to the interpolated intensity curve, and such that the mask value of the respective pixel of the mask receives a second value (for example a value of 1) when, according to the intensity curve, the pixel value of the respective image pixel of the preliminary MR image is greater than the pixel value of the p-quantile.

By the application of a correspondingly designed mask, after the application of the mask the MR image still comprises only the image pixels which belong to the ((1−p)*100%)-proportion of the image pixels within the preliminary MR image with the highest intensity. For example, if p=0.4 is selected, according to the third embodiment the quantile $Q_{.40}$ is determined, which corresponds to the percentile $P_{40}$. With a corresponding mask that is generated based on the quantile $Q_{.40}$, in an MR image those image pixels are suppressed that belong to the 40% of faintest image pixels within the preliminary MR image.

The generation of the special MR image preferably takes place with Cartesian scanning (in contrast to a radial scan preferred for the generation of the preliminary MR image), with the use of a simple gradient echo sequence.

The generation of the special MR image can take place with a lower resolution than the generation of the preliminary MR image. For example, the special MR image is generated with a resolution, wherein at most 64 pixels are present on a length of 0.5 m of the examination subject.

Due to the aforementioned properties, the special MR image can be created very quickly. Moreover, due to the low resolution the previously described stripe-shaped artifacts can be nearly completely prevented in the special MR image.

The mask of the receiver coil element is expanded or enlarged by dilatation operation.

For example, a dilatation operation can be conducted by implementing the following steps at least once for the corresponding mask.

1. For each pixel of the mask, a preliminary mask value is set to the first mask value (0, for example).
2. For each pixel of the mask, a check is made as to whether the mask value of that pixel has the second value (1, for example), or whether a pixel that is adjacent to the pixel under consideration has the second value (1, for example). If either is the case, the preliminary mask value for this pixel is set to the second value.
3. For each pixel of the mask, the mask value is set equal to the preliminary mask value corresponding to this pixel. In the event that an additional pass is to be conducted, the dilatation operation begins again with Step 1, wherein now (in comparison to the previous pass) more pixels have the second value than the mask value.

The above method or procedure describes the dilatation or expansion of the mask in principle. For example, two pixels are considered to be adjacent if they are located directly next to one another in the same column or in the same row of the mask. However, it is also possible for two pixels to be considered to be adjacent when they are diagonally directly next to one another.

Through the dilatation, the mask is expanded at the edge, so a sub-segmentation is prevented, for example. However, as a result of the dilatation (small) gaps can be closed in the regions of the mask that have the second value as a mask value.

Moreover, it is possible to subject the mask to a low-pass filtering so that jumps of the mask values of the mask are reduced. The mask thus also has mask values that lie between the first value and the second value. If the first value corresponds to a value of 0 and the second value corresponds to a value of 1, the low-pass filtering ensures that the mask values of the mask in the regions in which a jump from 0 to 1 (or the reverse) was present before the low-pass filtering now lie between 0 and 1.

The present invention also encompasses a method to generate an MR image of an examination subject, wherein MR signals of the examination subject are acquired with multiple receiver coil elements with a magnetic resonance system, which is understood as an embodiment of the method according to the invention that is described above. This variant of the method according to the invention includes the following steps.

A spatially related sensitivity is determined for each receiver coil element. In other words, the sensitivity of the respective receiver coil element at this point is determined for each of these receiver coil elements for each region of the field of view of the respective receiver coil element.

A mask is generated for each receiver coil element depending on the predetermined sensitivity of the respective receiver coil element in order to mask a region of the MR image with the aid of this mask, wherein the respective receiver coil element has (at least) one predetermined sensitivity in this region. Expressed differently: one mask is generated per receiver coil element, such that the number of masks corresponds to the number of receiver coil elements. With the mask, for the corresponding receiver coil element those regions of the field of view in which the respective receiver coil element has a predetermined sensitivity can be differentiated from those regions of the field of view in which the respective receiver coil element does not have this predetermined sensitivity.

One or more RF excitation pulses and one or more magnetic field gradients are activated in order to acquire MR data with each of the receiver coil elements. A defined volume segment in the examination subject is excited via the switching of the RF excitation pulse(s) and the magnetic field gradient(s), and MR data are subsequently acquired as is typical in the prior art. Corresponding MR data are thereby acquired by each of these receiver coil elements.

Based on the MR data that have been acquired by one of the receiver coil elements, a preliminary MR image is created for this one receiver coil element. This procedure is implemented for each receiver coil element, such that the number of created preliminary MR images corresponds to the number of receiver coil elements.

The mask of the respective receiver coil element is applied to that preliminary MR image which has been created for this receiver coil element, such that an MR image of the respective receiver coil element is created. In particular, with the use of the mask those regions of the preliminary MR image are masked out in which the corresponding receiver coil element does not have the predetermined sensitivity.

The (complete) MR image of the examination subject is generated based on the MR images of the receiver coil elements. In other words: the MR images created for each receiver coil element and processed with the respective mask are assembled into a complete MR image.

The present invention also encompasses a magnetic resonance system to generate an MR image of an examination subject. The magnetic resonance system has a basic field magnet, a gradient field system, at least one RF transmission antenna, at least one receiver coil element and a control device. The control device serves to control the gradient field system and the at least one RF transmission antenna. Moreover, the control device is designed in order to receive measurement signals that have been detected by the at least one receiver coil element in order to receive measurement signals that have been acquired by the at least one receiver coil element and in order to evaluate these acquired measurement signals and create corresponding MR data. The magnetic resonance system is designed such that the magnetic resonance system determines a spatially related sensitivity for each receiver coil element. Moreover, the magnetic resonance system generates a mask for each receiver coil element depending on the sensitivity of the respective receiver coil element in order—with the use of the corresponding mask— to mask a region of the MR image in which the corresponding receiver coil element has at least one predetermined sensitivity. The control device is configured to operate the magnetic resonance system so as to activate (radiate) at least one RF excitation pulse and at least one magnetic field gradient such that MR data are acquired with each receiver coil element of the magnetic resonance system. For each receiver coil element, the magnetic resonance system generates a preliminary MR image that is exclusively dependent on those MR data that have been generated with this receiver coil element. The magnetic resonance system subsequently applies the mask of the respective receiver coil element to the corresponding preliminary MR image that was generated depending on the MR data that have been detected by the corresponding receiver coil element in order to produce an MR image of the corresponding receiver coil element. Finally, the magnetic resonance system generates the MR image of the examination subject based on the MR image(s) created for the respective receiver coil element.

The magnetic resonance system according to the invention exists in two variants. According to the first variant, the magnetic resonance system has only a single receiver coil element. In this case, "for each receiver coil element" is equivalent to "for this receiver coil element". Moreover, in this case the MR image of the examination subject MR image corresponds to the MR image of the receiver coil element which was processed with the mask of this receiver coil element.

According to the second variant (which is significantly more often used), the magnetic resonance system has multiple receiver coil elements. In this case, the magnetic resonance system creates the MR image of the examination subject by the MR image of the examination subject being combined or assembled from the multiple MR images of the respective receiver coil elements.

The advantages of the magnetic resonance system according to the invention essentially correspond to the advantages of the method according to the invention that have been described in detail above.

The above object also is achieved in accordance with the present invention by a non-transitory, computer-readable data storage medium that is encoded with programming instructions (commands) that, when the storage medium is loaded into a computerized control and evaluation system of a magnetic resonance apparatus, cause the control and evaluation system to operate the magnetic resonance apparatus in accordance with one or more of the above-described embodiments of the method according to the invention.

The electronically readable data storage medium can be, for example, a DVD, a magnetic tape or a USB stick on which is stored electronically readable control information.

The present invention is particularly suitable for generating artifact-free MR images with a UTE sequence (sequence with ultrashort echo time) given a radial scanning with a combined PET/MR system. Naturally, however, the present invention is not limited to this preferred field of application since the present invention can also be used to create MR images whose MR data are acquired with other sequences (and, for example, with Cartesian scanning by means of a magnetic resonance system). When the method according to the invention is used with a Cartesian scan, remainder errors or artifacts that occur in parallel imaging methods (GRAPPA, for example—"GeneRalized Autocalibrating Partially Parallel Acquisition") can be at least attenuated. Moreover, in this case artifacts that occur due to a movement of the examination subject and due to phase deviations in an acquisition with multiple segments can be reduced.

DESCRIPTION OF THE PREFERRED EMBODIMENTS

Figure 1:
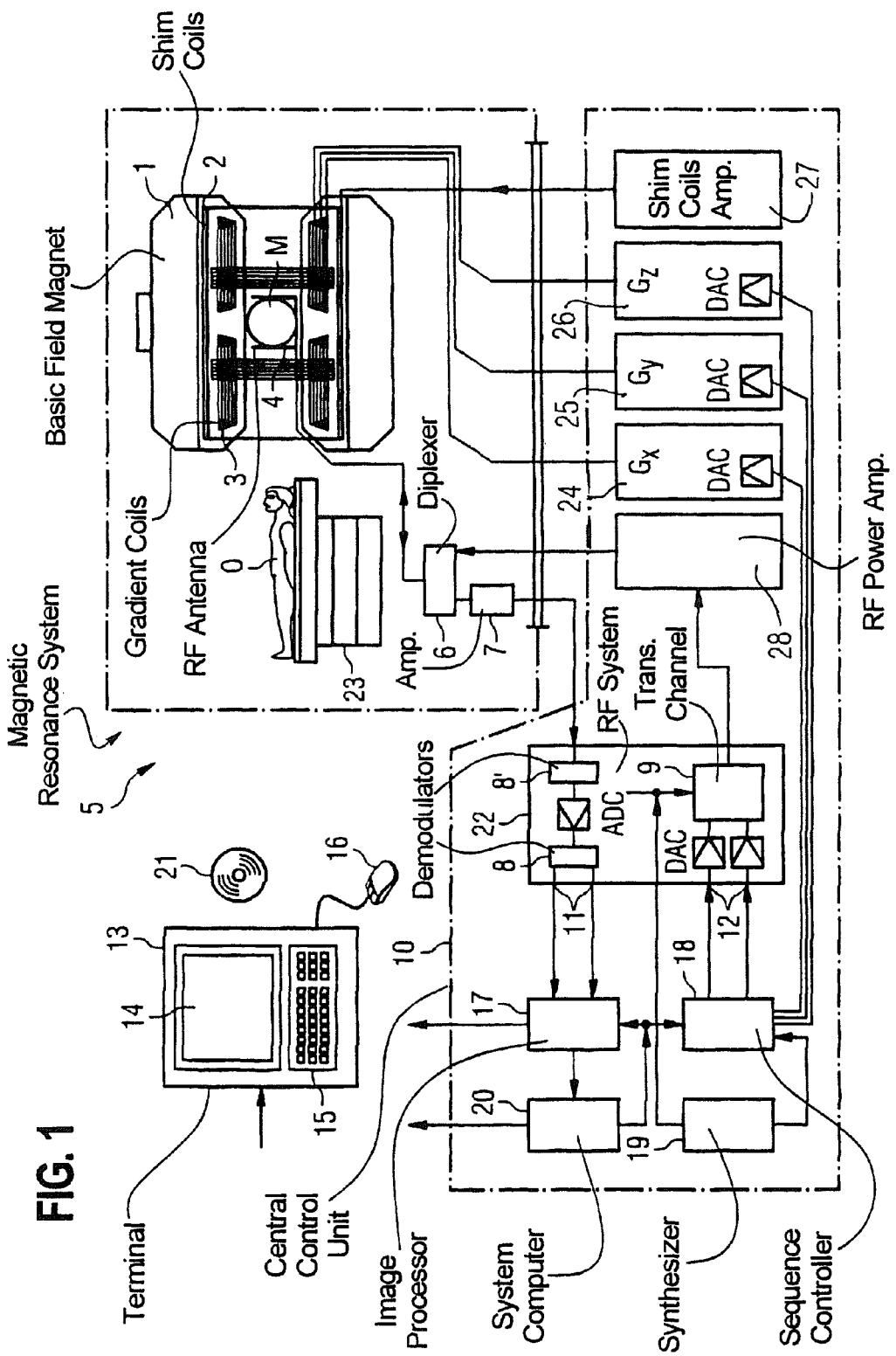
FIG. 1 depicts a magnetic resonance system according to the invention.

FIG. 1 is a schematic representation of a magnetic resonance system 5 for magnetic resonance imaging or magnetic resonance tomography. A basic field magnet 1 generates a temporally constant, strong magnetic field for polarization or alignment of the nuclear spins in a volume segment of an examination subject O, for example of a part of a human body that is to be examined. This part lies on a table 23 and is driven into the magnetic resonance system 5 for examination or measurement. The high homogeneity of the basic magnetic field that is required for the magnetic resonance measurement (data acquisition) is defined in a typically spherical measurement volume M in which are arranged the parts of the human body that are to be examined. To support the homogeneity requirements, and in particular to eliminate temporally invariable influences, known as shim plates made of ferromagnetic material are mounted at a suitable point. Temporally variable influences are eliminated by shim coils 2 operated by a shim coils amplifier 27.

A cylindrical gradient coil system 3 that has three sub-windings is incorporated in the basic field magnet 1. Each sub-winding is supplied by an amplifier with current to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier includes a digital/analog converter that is controlled by a sequence controller 18 for accurately timed generation of gradient pulses.

Located within the gradient field system 3 is one (or more) radio-frequency antennas 4 that convert the radio-frequency pulses emitted by a radio-frequency power amplifier into an alternating magnetic field to excite the nuclei and align the nuclear spins of the subject O to be examined or of the region of the subject O that is to be examined. Each radio-frequency antenna 4 has one or more RF transmission coils and multiple RF reception coils in the form of an annular (advantageously linear or matrix-like) arrangement of component coils. The alternating field emanating from the processing nuclear spins—i.e. normally the nuclear spin echo signals caused by a pulse sequence composed of one or more radio-frequency pulses and one or more gradient pulses—is also transduced by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are thereby represented digitally in the sequence controller 18 as a series of complex numbers. This number series is supplied as real part and imaginary part via respective inputs 12 to a digital/analog converter in the radio-frequency system 22, and from this to a transmission channel 9. In the transmission channel 9 the pulse sequences are modulated on a radio-frequency carrier signal whose base frequency corresponds to the center frequency, and the modulated signal is supplied to an RF power amplifier 28 that powers the RF antenna 4.

The switch-over from transmission operation to reception operation takes place via a transmission/reception diplexer 6. The RF transmission coils of the radio-frequency antennas 4 radiate the radio-frequency pulses into the measurement volume M to excite the nuclear spins, and resulting echo signals are sampled via the RF reception coils. The correspondingly acquired magnetic resonance signals are phase-sensitively demodulated at an intermediate frequency in a reception channel 8' (first demodulator) of the radio-frequency system 22 and are digitized in the analog/digital converter (ADC). This signal is further demodulated to a frequency of 0. The demodulation to a frequency of 0 and the separation into real part and imaginary part occur after the digitization in the digital domain in a second demodulator 8. An MR image or three-dimensional image data set is reconstructed by an image computer 17 from the measurement data acquired in such a manner. The administration of the measurement data, the image data and the control programs takes place via the system computer 20. Based on a specification with control programs, the sequence controller 18 controls the generation of the respective desired pulse sequences and the corresponding scanning of k-space. In particular, the sequence controller 18 controls the accurately-timed switching of the gradients, the emission of the radio-frequency pulses with defined phase amplitude, and the reception of the nuclear magnetic resonance signals. The time base for the radio-frequency system 22 and the sequence controller 18 is provided by a synthesizer 19. The selection of corresponding control programs to generate an MR image (which is stored on a DVD 21, for example) and the presentation of the generated MR image take place via a terminal 13 which comprises a keyboard 15, a mouse 16 and a monitor 14.

Figure 2:
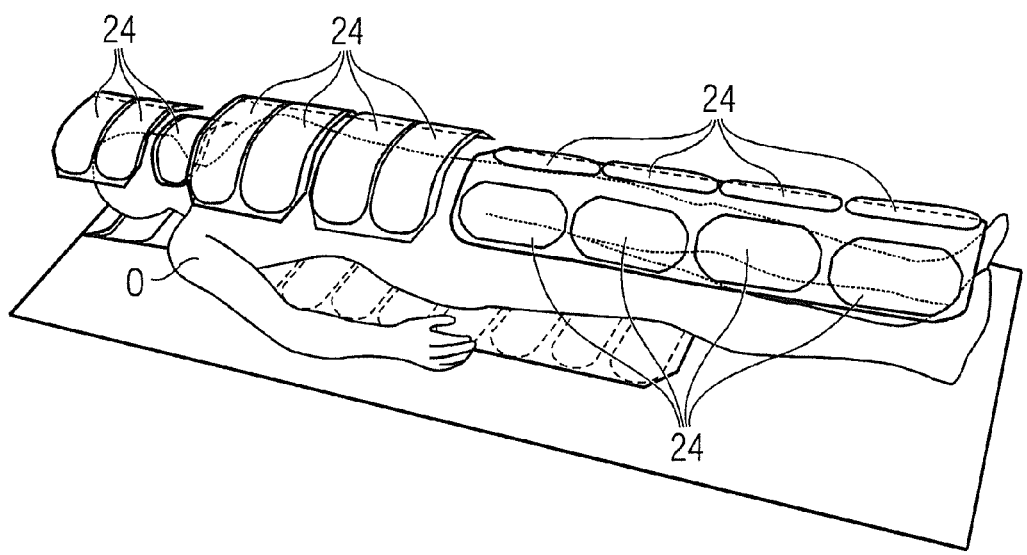
FIG. 2 shows an examination subject covered by multiple receiver coil elements.

FIG. 2 shows an examination subject O on which are arranged numerous receiver coil elements 24. Each of these receiver coil elements 24 detects MR signals from a volume segment within the examination subject O, wherein this respective volume segment lies in the immediate proximity of the respective receiver coil element 24. A receiver coil element within the scope of the invention means a type of antenna with which changes of a magnetic field can be detected.

Figure 3:
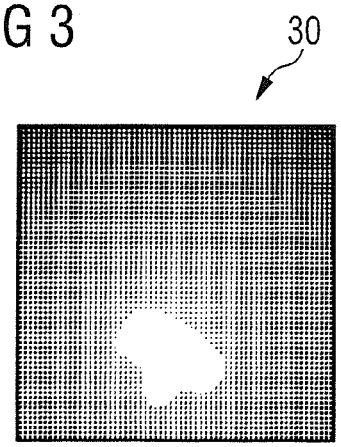
FIG. 3 shows a special MR image acquired according to the invention.

Shown in FIG. 3 is a special MR image 30 that was generated using MR data that have been acquired exclusively with a specific receiver coil element 24.

Figure 4:
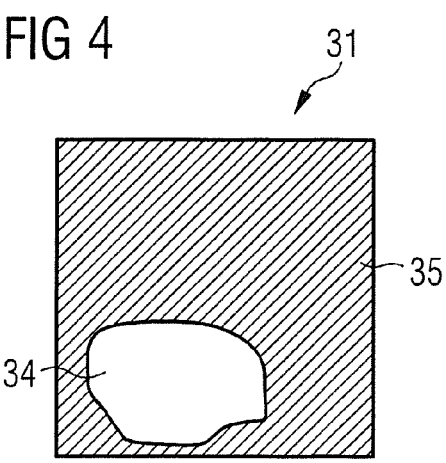
FIG. 4 illustrates a mask that is generated based on the special MR image shown in FIG. 3.

A mask 31 (which is depicted in FIG. 4) has been generated based on the special MR image 30 shown in FIG. 3. The light portion 34 of the mask 31 corresponds to that region of the mask 31 in which the corresponding pixels of the mask 31 have a mask value of 1, while the dark portion 35 of the mask 31 corresponds to that region of the mask 31 in which the corresponding pixels of the mask 31 have a mask value of 0. In the transition region between the dark region 35 and the light region 34, the pixels of the mask 31 can have a mask value which is between 0 and 1.

When the mask 31 is applied to an MR image, for each image pixel of the MR image the pixel value of this image pixel is multiplied with that mask value which is possessed by the pixel of the mask corresponding to this image pixel. Since—as described above—the pixels of the mask in the light region 34 of the mask 31 have the mask value of 1, the light region 34 corresponds to that region of the MR image which is not modified by the mask 31. In contrast to this, the dark region 35 of the mask 31 corresponds to that region of the MR image which is masked out by the mask 31.

Figure 5:
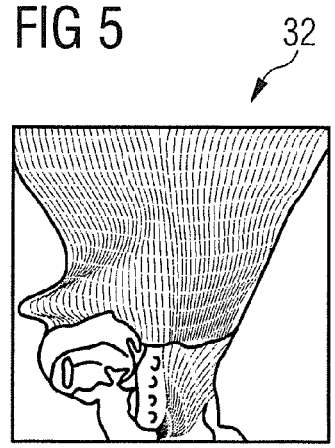
FIG. 5 shows an MR image created without the masks according to the invention.

In FIG. 5, an MR image is shown as it is generated according to the prior art. For this, the MR data which are acquired by multiple receiver coil elements are accordingly combined, whereby the MR image depicted in FIG. 5 results. Stripe-shaped artifacts are currently apparent in the upper part of the MR image.

Figure 6:
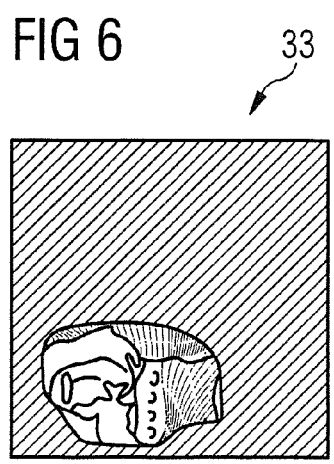
FIG. 6 shows the MR image depicted in FIG. 5, but with the masks according to the invention being used.

In contrast, in FIG. 6 an MR image is shown which was created according to the invention and has virtually the same section from an examination subject O as the MR image depicted in FIG. 5. This MR image has also been generated from MR data which were acquired by multiple receiver coil elements. For this purpose, an MR image is generated first for each receiver coil element, which MR image was reconstructed exclusively from those MR data which were acquired by this receiver coil element. The mask generated for the respective receiver coil element was subsequently applied to this MR image. Finally, the masked MR images of the receiver coil elements were combined to create the MR image 33 shown in FIG. 6.

The generation according to the invention of a mask for a receiver coil element should be explained in detail with FIGS. 7 through 11.

In order to create a mask 31 for a receiver coil element 24, a special MR image is first reconstructed from MR data that have been acquired exclusively by this receiver coil element 24. The special MR image is generated by the respective examination subject to be examined. In other words: the creation of the mask 31 is advantageously repeated (for each receiver coil element and) for each examination subject of which MR images are to be created.

Figure 7:
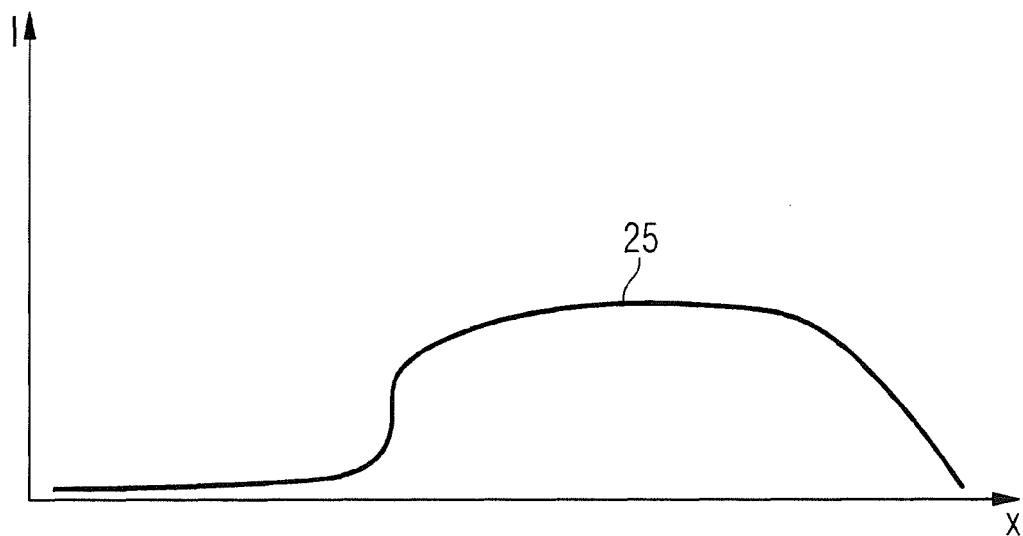
FIG. 7 shows an interpolated intensity curve of a special MR image along a straight line in the x-direction.

An interpolated intensity curve 25 in the x-direction across the special MR image is shown in FIG. 7. Expressed in a different way: the pixel value or the intensity or, respectively, the brightness is determined for each image pixel of the special MR image along a straight line which extends in the x-direction across the special MR image. These image pixels of the special MR image serve as node points of an interpolation method which creates the interpolated intensity curve 25 shown in FIG. 7. In other words: for each arbitrary image pixel along the selected straight lines, the curve 25 in FIG. 7 indicates which pixel value the corresponding image pixel has, wherein the corresponding image pixel in FIG. 7 is represented by its x-value.

Figure 8:
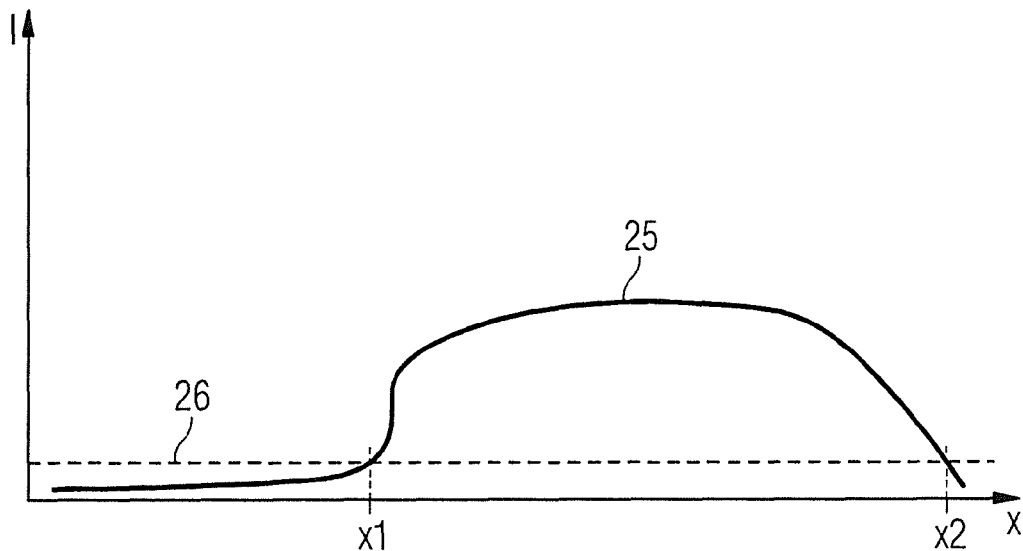
FIG. 8 shows the interpolated intensity curve shown in FIG. 7, together with a threshold pixel value.
Figure 9:
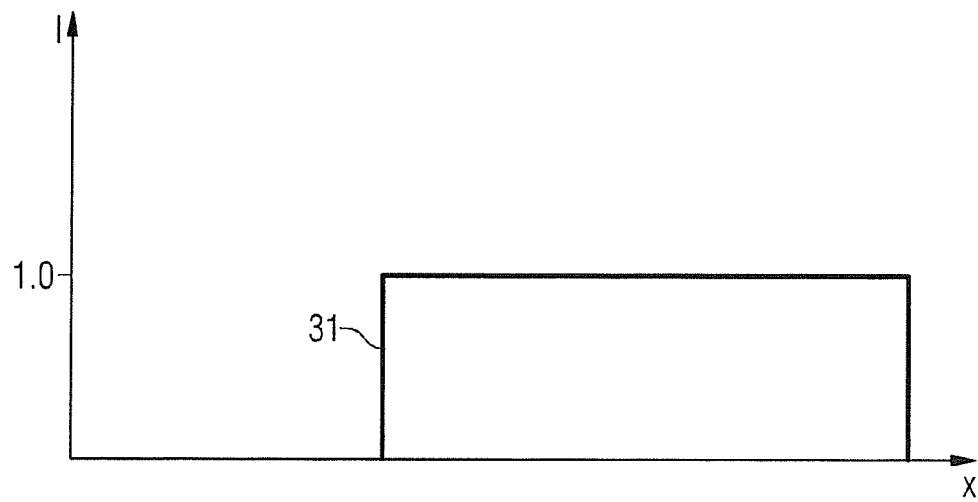
FIG. 9 shows a mask which was created based on the interpolated intensity curve shown in FIGS. 7 and 8.

Based on this intensity curve 25, a threshold pixel value 26 is determined which is depicted in addition to the intensity curve 25 in FIG. 8. For example, the threshold pixel value 26 can correspond to a fraction of the maximum intensity value or pixel value of the intensity curve 25.

The mask 31 to be created defines a mask value for each pixel of the MR image to be processed by the mask 31. The mask value for a specific image pixel of the MR image to be processed thereby has a value of 1 or, respectively, 1.0 when the pixel value of the intensity curve 25 at the point corresponding to the image pixel is greater than the threshold pixel value 26. In contrast, the mask value for a specific image pixel of the MR image to be processed is set to a value of 0 when the pixel value of the intensity curve 25 at the point corresponding to this pixel is less than or equal to the threshold pixel value 26. The mask 31 shown in FIG. 9 therefore results. It is apparent that those points x1, x2 at which the mask value of the mask 31 jumps from the value 1 to the value 0 correspond to those points in the intensity curve 25 (see FIG. 8) at which the intensity curve 25 corresponds to the threshold pixel value 26.

It is noted that the mask 31 not only corresponds to the region between the two points x1 and x2, but rather that the mask 31 essentially defines a mask value for each x-value.

For reasons of presentation, the intensity curve 25 (and therefore the generation of the mask 31 in FIGS. 7 through 9) was explained using only a one-dimensional curve (traveling in the x-direction). Naturally, a corresponding intensity curve 25 can also be represented as an area, wherein this area represents the corresponding intensity value or pixel value for each image pixel of the special MR image.

Figure 10:
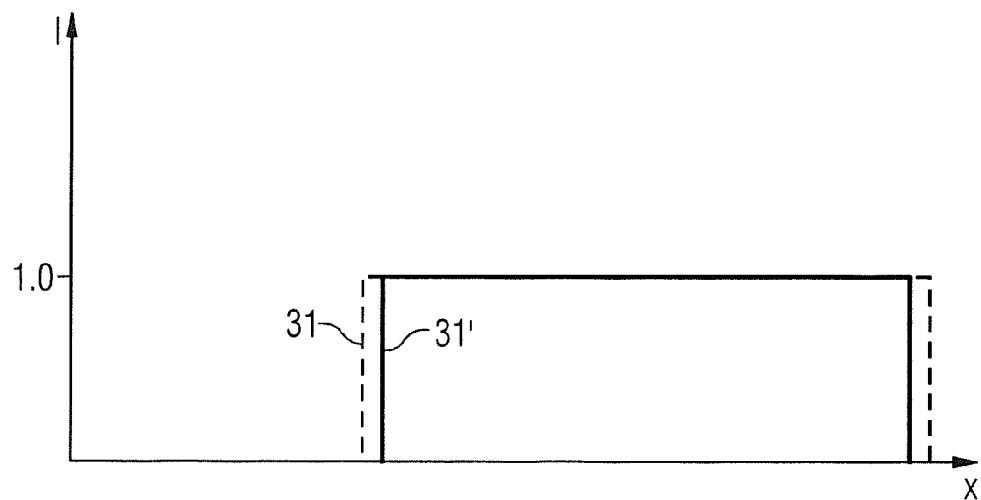
FIG. 10 shows masks respectively before and after a dilatation operation according to the invention.

A dilatation operation at a mask 31 is explained as an example with FIG. 10. Via the dilatation operation, the mask 31' is essentially enlarged in all directions at the edge of that region 34 of the mask in which the mask values correspond to the second value. In the one-dimensional case shown in FIG. 10, an expansion of the mask 31' thereby results both in the positive x-direction x and negative x-direction x. After a dilatation operation has taken place, the mask 31 results from the original mask 31'.

Figure 11:
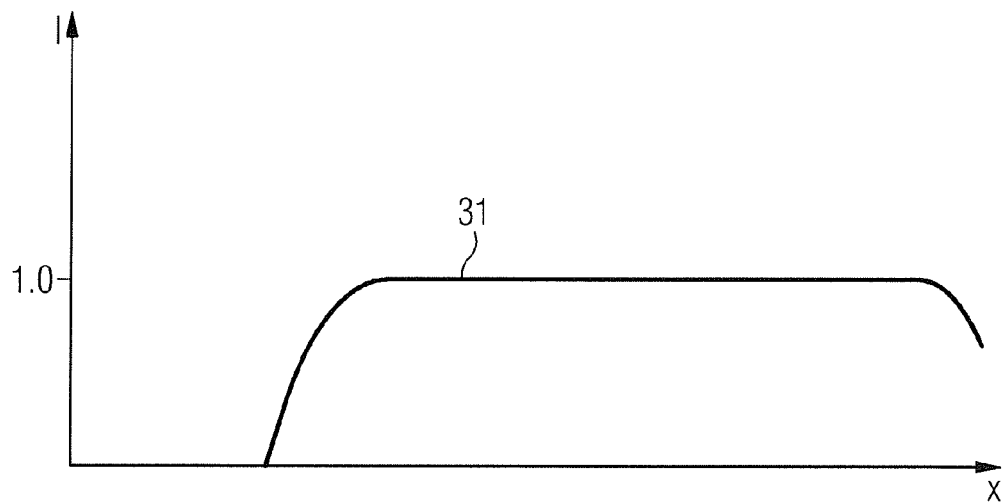
FIG. 11 shows a mask according to the invention after a lowpass filtering.

Finally, a lowpass filtering of the mask takes place, which then leads to the mask 31 shown in FIG. 11. Jumps in the mask values are advantageously smoothed via the lowpass filtering. Expressed differently, the lowpass filtering of the mask 31 ensures that the difference between the mask values of adjacent image pixels is small.

Figure 12:
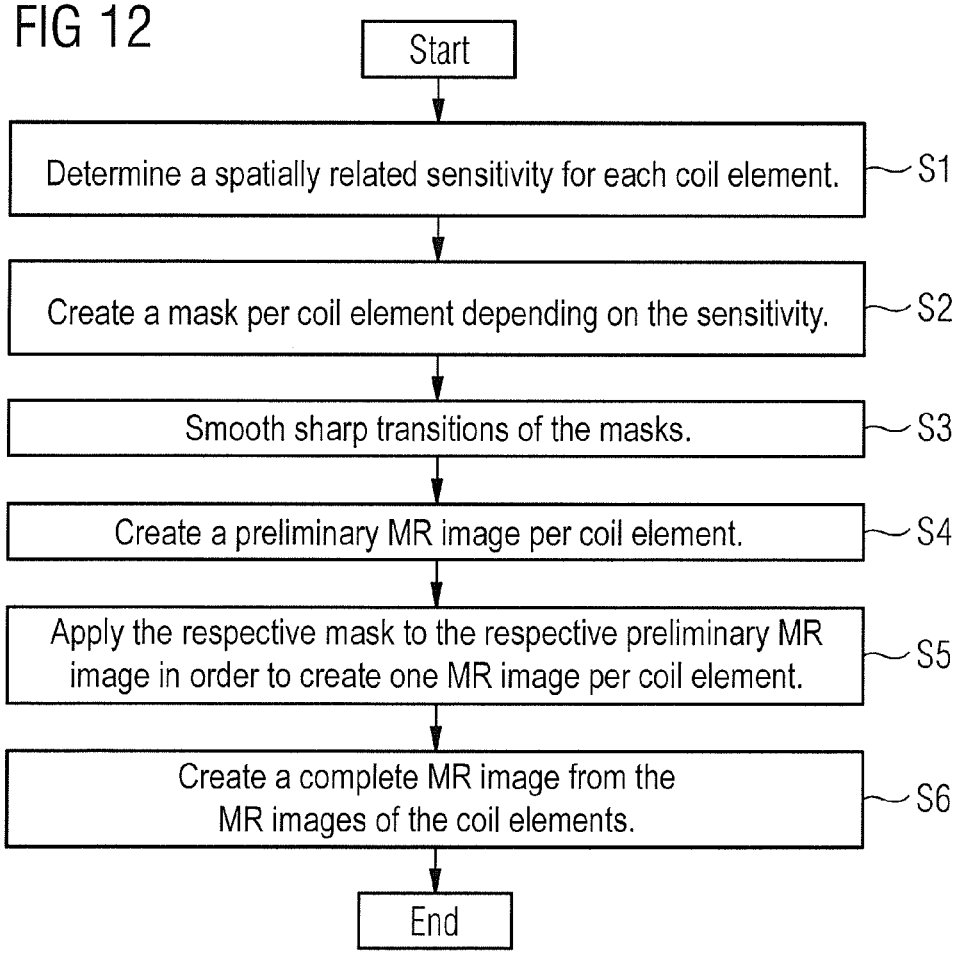
FIG. 12 is a flowchart of an embodiment of the method according to the invention.

The method according to the invention is shown in FIG. 12 using a flowchart.

The spatially related sensitivity for each coil element is determined in a first Step S1. This normally takes place via the generation of a special MR image, wherein the pixel value or the intensity of each image pixel of this special MR image is a measure of the sensitivity of the corresponding coil element at this point (at this image pixel). Based on these points (the number of points corresponds to the number of image pixels of the special MR pixel) that are defined by the coordinates of the corresponding image pixel and by the pixel value of the corresponding image pixel, an intensity curve (pixel value curve) can be created which indicates the corresponding intensity value or, respectively, pixel value for arbitrary coordinates. For example, this intensity curve is generated via an arbitrary interpolation method based on the known points. In the image pixels of the special MR image (wherein the image pixels form node points for the interpolation method), such a generated intensity curve or, respectively, pixel value curve corresponds exactly to the intensity or the pixel value corresponding to this image pixel, while the generated intensity curve approximates the intensity or the pixel value (i.e. approximately indicates) for points between the image pixels of the special MR image.

Depending on the spatially related sensitivity determined in the first Step S1, on Step S2 a mask is determined per coil element. For example, for this a threshold pixel value is determined according to a predetermined variant according to the invention, and the mask values of the mask are then determined with the aid of the intensity curve created in Step S1. For each image pixel of the MR image to be processed with the mask, said mask thereby respectively defines a mask value. It is noted that the image pixels of the MR image to be processed with the mask do not coincide with the image pixel of the special MR image. The special MR image normally has a lower number of image pixels than the MR image to be processed with the mask. In order to now create the mask values for each image pixel of the MR image to be processed—for example for each image pixel in which the intensity curve or pixel value curve determined in Step S1 has a pixel value which is less than the threshold pixel value—the corresponding mask value is set to a first value (0, for example). In contrast to this, the mask value for each image pixel of the MR image to be processed in which the pixel value curve has a pixel value which is greater than (or equal) to the threshold pixel value the corresponding mask value is set to a second value (1, for example).

In the following Step S3, sharp transitions of the mask are smoothed, which is achieved in particular via a lowpass filtering. With this smoothing, the mask for specific image pixels of the MR image to be processed with the mask also defines mask values which lie between the first value and second value (thus that correspond to neither the first nor second value).

In Step S4, a preliminary MR image is subsequently respectively created for multiple coil elements. Expressed in a different way: a respective preliminary MR image is created by means of each of these multiple coil elements so that the number of preliminary MR images corresponds to the number of coil elements (that are used for this). Only those MR data which were acquired by the respective coil element are used to create a preliminary MR image.

In the next Step S5, the mask created per coil element (see Step S2) is applied to the preliminary MR image of this coil element in order to create a processed MR image per coil element. The application of the mask to the preliminary MR image means that, for each image pixel of the preliminary MR image, the pixel value of this image pixel is multiplied by the mask value which defines the respective mask for this image pixel. The result of this multiplication then corresponds to the pixel value of the image pixel of the processed MR image of the respective coil element. In other words: multiple processed MR images exist at the end of the step S5, wherein the number of processed MR images corresponds to the number of preliminary MR images or, respectively, the number of coil elements (used for this).

Finally, in the last Step S6 a complete MR image is created which is assembled from the processed MR images created in Step S5. In the simplest case, such an assembly or combination of the processed MR images can occur in that only one processed MR image exists which then corresponds to the complete MR image. This is the case when only one coil element is used to create the complete MR image, which corresponds to the MR image of the examination subject that is to be created. If multiple processed MR images exist (i.e. if multiple coil elements are used to create the complete MR image), the image pixels of this complete MR image can correspond to the image pixels of the respective processed MR images. In this case, for example, for an image pixel of the complete MR image the pixel values of all processed MR images for this image pixel are averaged.

In contrast to this, if the image pixels of the complete MR image do not correspond to the image pixels of the respective processed MR images, each processed MR image normally corresponds to only a portion of the complete MR image. In this case, the complete MR image is essentially assembled from the multiple processed MR images. If an image pixel of the complete MR image corresponds to an image pixel of multiple processed MR images, the pixel value of this image change can in turn be determined by a corresponding averaging of the pixel values of the corresponding image pixels of these multiple processed MR images.

Although modifications and changes may be suggested by those skilled in the art, it is the intention of the inventors to embody within the patent warranted hereon all changes and modifications as reasonably and properly come within the scope of their contributions to the art.

We claim as our invention:

1. A method to generate a magnetic resonance (MR) image of an examination subject, comprising:
   providing a processor with information representing a spatial sensitivity of a receiver coil element of a receiver coil array, comprising a plurality of receiver coil elements, in an MR data acquisition scanner that will be used to acquire MR data from an examination subject, from which MR data an MR image of the examination subject will be generated;
   in said processor, automatically generating a mask for each receiver coil element of said receiver coil array dependent on said spatial sensitivity of that respective receiver coil element, in order to mask a region of said MR image using said mask, said region being a region of said MR image in which that respective receiver coil element has at least one predetermined sensitivity;
   from said processor, operating said MR data acquisition scanner to generate at least one RF excitation pulse and at least one magnetic field gradient in order to acquire said MR data from the examination subject with each receiver coil element of said receiver coil array;
   in said processor, generating, for each receiver coil element, a preliminary MR image using only the MR data acquired with that respective receiver coil element;
   in said processor, applying, for each receiver coil element, said mask to the preliminary MR image for that respective receiver coil element in order to generate an MR image for that respective receiver coil element; and
   in said processor, generating said MR image of the examination subject by assembling said MR images generated for the respective receiver coil elements, and making said MR image available as a data file at an output of said processor.

2. A method as claimed in claim 1 comprising generating said mask by:
   in said processor, generating, for each receiver coil element a special MR image from only said MR data acquired by that respective receiver coil element, said special MR image being comprised of pixels each having a respective pixel value; and
   generating said mask for that respective receiver coil element dependent on a maximum pixel value in said special MR image for that respective receiver coil element.

3. A method as claimed in claim 2 wherein each preliminary MR image is also comprised of a plurality of pixels, each having a respective pixel value, and wherein said method comprises, for each receiver coil element:
   in said processor, generating a threshold pixel value as a predetermined percentage of said maximum pixel value;
   in said processor, generating a pixel value curve by interpolating respective pixel values of the pixels of said special MR image; and
   in said processor, generating a mask value for each pixel of said preliminary MR image by assigning said mask value for a respective pixel a first value when, according to said pixel value curve, the pixel value of the respective pixel of the preliminary MR image is below said threshold pixel value, and otherwise assigning said mask value for the respective pixel of said preliminary MR image a second value, that is different from said first value.

4. A method as claimed in claim 3 comprising enlarging each mask for each respective receiver coil element with a dilation procedure comprising:
   for each respective pixel in said preliminary MR image, determining (a) whether said mask has said second value as a mask value and (b) whether a pixel adjacent to the respective pixel has said second mask value; and
   if either (a) or (b) is determined to exist, assigning the mask said second value for the respective pixel.

5. A method as claimed in claim 3 comprising lowpass filtering each mask to smooth discontinuous transitions between said first and second values.

6. A method as claimed in claim 2 comprising generating said special MR image by operating said MR data acquisition scanner with a gradient echo sequence with Cartesian scanning of k-space.

7. A method as claimed in claim 2 comprising generating said special MR image with a resolution of a maximum of 64 pixels per 0.5 m of length of the examination subject.

8. A method as claimed in claim 1 comprising generating each mask for each respective receiver coil element by:
   in said processor, generating a special MR image from only said MR data acquired by that respective receiver coil element, said special MR image being comprised of pixels each having a respective pixel value;
   determining a frequency distribution that, for all respective pixel values of the special MR image, indicates a frequency at which each pixel value of the special MR image occurs; and
   in said processor, generating each mask dependent on said frequency distribution in the respective special MR image for that respective receiver coil element.

9. A method as claimed in claim 8 wherein each preliminary MR image is also comprised of pixels each having a respective pixel value, and comprising:

in said processor, determining the two highest relative maxima of said frequency distribution;

in said processor, determining a threshold pixel value that is between respective pixel values of the two pixels corresponding to said two highest relative maxima of said frequency distribution; and in said processor, generating a mask value for each pixel of said preliminary MR image by assigning said mask value for a respective pixel a first value when, according to said pixel value curve, the pixel value of the respective pixel of the preliminary MR image is below said threshold pixel value, and otherwise assigning said mask value for the respective pixel of said preliminary MR image a second value, that is different from said first value.

10. A method as claimed in claim 9 comprising enlarging each mask with a dilation procedure comprising:

for each respective pixel in said preliminary MR image, determining (a) whether said mask has said second value as a mask value and (b) whether a pixel adjacent to the respective pixel has said second mask value; and if either (a) or (b) is determined to exist, assigning the mask said second value for the respective pixel.

11. A method as claimed in claim 9 comprising lowpass filtering each mask to smooth discontinuous transitions between said first and second values.

12. A method as claimed in claim 8 comprising generating said special MR image by operating said MR data acquisition scanner with a gradient echo sequence with Cartesian scanning of k-space.

13. A method as claimed in claim 8 comprising generating said special MR image with a resolution of a maximum of 64 pixels per 0.5 m of length of the examination subject.

14. A method as claimed in claim 2 wherein said preliminary MR image is also comprised of a plurality of pixels, each having a respective pixel value, and wherein said method comprises, for each receiver coil element:

in said processor, generating a threshold pixel value as a predetermined percentage of said maximum pixel value;

in said processor, determining a p-quantile of the pixel values of said special MR image wherein p*100 percent of the pixels of the special MR image have a lower pixel value than a pixel value of said p-quantile, wherein p is a shortfall proportion of said p-quantile; and in said processor, generating said mask dependent on said p-quantile.

15. A method as claimed in claim 14 wherein said preliminary MR image is also comprised of a plurality of pixels, each having a respective pixel value, and wherein said method comprises, for each receiver coil element:

in said processor, generating a mask value for each pixel of said preliminary MR image by assigning said mask value for a respective pixel a first value when, according to said pixel value curve, the pixel value of the respective pixel of the preliminary MR image is below said pixel value of said p-quantile, and otherwise assigning said mask value for the respective pixel of said preliminary MR image a second value, that is different from said first value.

16. A method as claimed in claim 15 comprising enlarging each mask with a dilation procedure comprising:

for each respective pixel in said preliminary MR image, determining (a) whether said mask has said second value as a mask value and (b) whether a pixel adjacent to the respective pixel has said second mask value; and if either (a) or (b) is determined to exist, assigning the mask said second value for the respective pixel.

17. A method as claimed in claim 14 comprising lowpass filtering each mask to smooth discontinuous transitions between said first and second values.

18. A method as claimed in claim 14 comprising generating said special MR image by operating said MR data acquisition unit with a gradient echo sequence with Cartesian scanning of k-space.

19. A method as claimed in claim 14 comprising generating said special MR image with a resolution of a maximum of 64 pixels per 0.5 m of length of the examination subject.

20. A method as claimed in claim 1 comprising, in said processor, enlarging said mask by implementing a dilation procedure.

21. A magnetic resonance apparatus to generate a magnetic resonance (MR) image of an examination subject, comprising:

an MR data acquisition scanner having a receiver coil array comprising a plurality of receiver coil elements;

a processor provided with information representing a spatial sensitivity of the receiver coil element of the receiver coil array that will be used to acquire MR data from an examination subject, from which MR data an MR image of the examination subject will be generated;

said processor being configured to automatically generate a mask for each receiver coil element dependent on said spatial sensitivity of that respective receiver coil element, in order to mask a region of said MR image using said mask, said region being a region of said MR image in which that respective receiver coil element has at least one predetermined sensitivity;

said processor being configured to operate said MR data acquisition apparatus to generate at least one RF excitation pulse and at least one magnetic field gradient in order to acquire said MR data from the examination subject with said receiver coil elements of said receiver coil array;

said processor being configured to generate a preliminary MR image for each receiver coil element using only the MR data acquired with that respective receiver coil element;

said processor being configured to apply said mask for each receiver coil element to the preliminary MR image for that respective receiver coil element in order to generate an MR image for that respective receiver coil element; and said processor being configured to generate said MR image of the examination subject by assembling said MR images generated for the respective receiver coil elements, and to make said MR image available as a data file at an output of said processor.

22. A non-transitory, computer-readable data storage medium encoded with programming instructions, said data storage medium being loaded into a computerized processing and control system of a magnetic resonance (MR) apparatus that also comprises an MR data acquisition scanner comprising a receiver coil array comprising a plurality of receiver coil elements, said programming instructions causing said computerized control and processing system to:

receive information representing a spatial sensitivity of each receiver coil element of the MR data acquisition scanner that will be used to acquire MR data from an examination subject, from which MR data an MR image of the examination subject will be generated;

generate a mask for each receiver coil element dependent on said spatial sensitivity of that respective receiver coil element, in order to mask a region of said MR image using said mask, said region being a region of said MR image in which that respective receiver coil element has at least one predetermined sensitivity;

operate said MR data acquisition scanner to generate at least one RF excitation pulse and at least one magnetic field gradient in order to acquire said MR data from the examination subject with said receiver coil elements of the receiver coil array;

generate a preliminary MR image for each receiver coil element using only the MR data acquired with that respective receiver coil element;

apply said mask for each receiver coil element to said preliminary MR image for that respective receiver coil element in order to generate an MR image for that respective receiver coil element; and generate said MR image of the examination subject by assembling said MR images for the respective receiver coil elements, and make said MR image available as a data file at an output of said control and processing system.

* * * * *